United States Patent [19]
Horiuchi et al.

[11] Patent Number: 5,387,445
[45] Date of Patent: Feb. 7, 1995

[54] LIQUID CRYSTAL DISPLAY DEVICE

[75] Inventors: Shin Horiuchi; Sumio Wakabayashi; Takahisa Doba, all of Ibaraki, Japan

[73] Assignee: Zeneca Limited, London, England

[21] Appl. No.: 847,170

[22] Filed: Mar. 9, 1992

[30] Foreign Application Priority Data

Mar. 8, 1991 [JP] Japan ................................. 3-069348

[51] Int. Cl.⁶ .......................................... G02F 1/1339
[52] U.S. Cl. .......................................... 428/1; 359/80; 522/180
[58] Field of Search ................ 428/1; 359/80; 522/180

[56] References Cited

U.S. PATENT DOCUMENTS

| | | | |
|---|---|---|---|
| 3,714,290 | 1/1973 | Kehr et al. | 522/180 |
| 4,272,586 | 6/1981 | Ando et al. | 522/180 |
| 4,297,401 | 10/1981 | Chern et al. | 428/1 |
| 4,494,825 | 1/1985 | Sasaki et al. | 350/343 |

FOREIGN PATENT DOCUMENTS

| | | | |
|---|---|---|---|
| 0205261 | 12/1986 | European Pat. Off. | C09K 19/00 |
| 8906264 | 7/1989 | WIPO | C09K 19/00 |

*Primary Examiner*—Alexander S. Thomas
*Attorney, Agent, or Firm*—Cushman, Darby & Cushman

[57] ABSTRACT

A liquid crystal display device including two electrically insulating substrates, electrodes on the inner surfaces of the substrates, a film of liquid crystal material contained between the electrodes and a resinous material as sealant and/or encapsulant and/or inner structural component characterised in that the resinous material is the product of light-curing a light-curable resin composition comprising at least one compound having two or more non-aromatic carbon-carbon unsaturated bonds per molecule, at least one compound having two or more mercapto groups per molecule and a photoinitiator.

4 Claims, 2 Drawing Sheets

LIQUID CRYSTAL DISPLAY DEVICE

This invention relates to the use of a light curable resin composition for the sealing and/or encapsulation and/or inner construction of a liquid crystal cell and to the derived liquid crystal display device.

Generally, a liquid crystal cell suitable for use as a display device is formed by bonding together at their peripheral parts two sheets or plates of an electrically insulating substrate, provided on their inner surfaces with transparent electrodes, using a sealant in the shape of a frame to maintain the substrates at a fixed and uniform distance apart and then feeding the liquid crystal material into the cell through a small inlet formed by leaving an aperture in the sealant and subsequently closing the inlet with an encapsulant.

It is essential that the sealant or encapsulant should have excellent adhesion to the substrate, for example glass, and that it should not disturb the alignment of the liquid crystal and it is known to use a thermosetting epoxy resin for this purpose. However, since an epoxy resin needs an extended high temperature cure, production line difficulties have been experienced. Also, when the liquid crystal inlet of the cell is encapsulated with an epoxy resin, heating the resin can cause it to flow into the liquid crystal material so that the properties of the liquid crystal are adversely affected. On the other hand, cure at room temperature not only extends the cure time but also prolongs the contact time between the liquid crystal and the uncured epoxy resin so that low molecular weight ingredients of the resin diffuse into the liquid crystal bringing about a deterioration in performance by, for example, disturbing the alignment of the liquid crystal or lowering its insulation property.

In order to solve these problems, the use of a UV-curable resin as sealant or encapsulant for a liquid crystal cell has been proposed. UV-curable resins include radical polymerisation type resins in which acrylic monomers and oligomers are cured by photoinitiated radical polymerisation and cationic type resins in which an epoxy resin is cured by photoinitiated cationic polymerisation under the action of UV radiation and the like using an aromatic onium salt and the like as photoinitiator. The use of these resins for the sealing and/or encapsulation of liquid crystal cells has been described in Japanese Patent Disclosures 59-93715 and 61-233719. However, in the case of the photoradical polymerisation type resin, polymerisation is inhibited by atmospheric oxygen so that residual monomer and/or oligomer in the cured resin diffuses gradually into the liquid crystal disturbing the alignment thereof and finally impairing the performance of the liquid crystal display. Furthermore, a significant shrinkage in volume results from the polymerisation of the acrylic and/or methacrylic entity and internal stress increases in the cured resin so that adhesion between the cured resin and the glass substrate becomes insufficient to prevent ingress of moisture into the cell and therefore perfect encapsulation cannot be achieved. In the case of the photocationic polymerisation type resin, inhibition by atmospheric oxygen does not occur but polymerisation is disturbed by hydroxy groups and water in the system so that low molecular weight material remains in the cured polymer to diffuse into the liquid crystal and disturb its alignment, again adversely affecting the performance of the liquid crystal display.

It has now been found that certain light curable resin compositions can be used for sealing and/or encapsulating and/or the inner construction of a liquid crystal cell and are able to provide stable liquid crystal cells having excellent working properties, the alignment of the liquid crystal remaining unaffected for long periods. The resin compositions are especially suitable for encapsulating the liquid crystal inlet of the cell.

Thus, in one aspect, the invention provides a liquid crystal display device including two electrically insulating substrates, electrodes on the inner surfaces of the substrates, a film of liquid crystal material contained between the electrodes and a resinous material as sealant and/or encapsulant and/or inner structural component characterised in that the resinous material is the product of light-curing a light-curable resin composition comprising at least one compound having two or more non-aromatic carbon-carbon unsaturated bonds per molecule, at least one compound having two or more mercapto groups per molecule and a photoinitiator.

Inhibition of polymerisation by oxygen found in conventional light curable resin compositions does not occur in the photopolymerisation reaction between a compound having at least two non-aromatic carbon-carbon unsaturated bonds per molecule (hereinafter referred to as a polyene) and a compound having at least two mercapto groups per molecule (hereinafter referred to as a polythiol). As a result, the concentration of uncured monomers and/or oligomers is lower than in a conventional light-curable acrylic resin composition and accordingly their diffusion into the liquid crystal is minimised so that disturbance of the alignment of the liquid crystal does not occur for a long time, the initial performance of the cell being maintained for a long period.

As specific examples of polyenes to be used in this invention, divinylbenzene, divinyltoluene, ethylene glycol diacrylate, ethylene glycol dimethacrylate, diethylene glycol diacrylate, diethylene glycol dimethacrylate, triethylene glycol diacrylate, triethylene glycol dimethacrylate, trimethylolpropane triacrylate, trimethylolpropane trimethacrylate, triallyl isocyanurate, triallyl cyanurate, tetra-allyloxy methane, diallyl fumarate, diallyl maleate, a reaction product between diallylamine and a polyepoxy compound, a reaction product between allyl isocyanate and a polyepoxy compound and the like may be mentioned but without limitation to these particular examples.

The second component, a compound having at least two mercapto groups per molecule, may be represented by the general formula

A—(SH)$_q$ wherein A is an organic residue and q is an integer of 2 or more.

As specific examples of polythiols, an ester of a thiol compound having a carboxyl group and a polyalcohol, for example trimethylolethane tris (mercaptoacetate), trimethylolethane tris (mercaptopropionate), trimethylolpropane tris(mercaptoacetate), trimethylolpropane tris (mercaptopropionate), pentaerythritol tetrakis (mercaptoacetate), pentaerythritol tetrakis (mercaptopropionate), ethylene glycol bis (mercaptoacetate), ethylene glycol bis (mercaptopropionate), polyethylene glycol bis (mercaptoacetate), polyethylene glycol bis (mercaptopropionate), dipentaerythritol hexakis (mercaptoacetate) and dipentaerythritol hexakis (mercaptopropionate), aliphatic polythiols, for example, dimercaptodiethyl ether, dimercaptopropane and dimercaptohexane; aromatic polythiols, for example, xylylene dimercaptan; a reaction product obtained by reaction of a polyepoxy compound with a polythiol containing mercapto group in stoichiometric excess; a reaction product of a polyepoxy compound with thioglycolic acid; an ester of a mercaptoalcohol and a polycarboxylic acid and an ester product of a polymercaptophenol and a polycarboxylic acid and the like may be mentioned and these may be used singly or as a mixture, but without limitation to these particular examples. In order to reduce the characteristic offensive odour of the mercapto group, it is preferable to use a reaction product obtained by a reaction between a polyepoxy compound and a polythiol, a reaction product obtained by a reaction between a polyepoxy compound and thioglycolic acid and the like which have an average molecular weight more than 300. The essential criteria for the sealant and/or the encapsulant of the liquid crystal cell are that there should be no leakage of liquid crystal and no disturbance and/or disorder in liquid crystal alignment for a long period of time. In the event, however, that other properties are desired, for example thermal resistance, solvent resistance, thermal shock-resistance and adhesion at low temperatures, the properties of the cured substance may be freely varied in the above mentioned reaction product between an epoxy resin and a polythiol by means of properly selecting the molecular structure of the epoxy resin to be used. For example, in cases where thermal resistance and solvent resistance are required as the properties of the cured substance, a phenolnovolak type resin or bisphenol A type resin may be selected as an epoxy resin. Also, in cases where adhesion at low temperature is required, a polyglycol type resin may be selected.

There is no restriction on the photopolymerization initiator to be used. As specific examples, benzophenone, p-methoxybenzophenone, xanthone, chloroxanthone, m-chloro-acetophenone, propiophenone, anthraquinone, camphorquinone, trimethylbenzoyl diphenylphosphine oxide and benzil may be mentioned but without limitation to these particular examples.

A preferred mixing ratio of the components in the resin composition is within a range between 1:0.1 and 1:3, and preferably in a range between 1:0.5 and 1:2 as a stoichiometric ratio of the non-aromatic carbon-carbon unsaturated bond in the polyene compound to SH group in the polythiol, but other ratios are not excluded. Suitable quantities of photopolymerization initiator are within a range from 0.1 wt % to 5 wt % of the total quantity of the resin, but other amounts are not excluded.

When encapsulating the inlet of the liquid crystal cell, if the viscosity of a resin composition is too low, the resin infuses deeply into the liquid crystal to adversely affect the performance of the liquid crystal cell and if the viscosity is too high, a suitable infusion of the resin into the liquid crystal inlet becomes difficult so that production problems occur. The preferred viscosity of the resin composition is therefore within a range between 10 and 1000 poises and especially between 20 and 500 poises at 25° C. To adjust the viscosity of the resin composition of this invention, a polyene and/or a polythiol having a low viscosity may be used as a reaction diluent, or aerosil (fine particles of highly pure anhydrous silica; "Aerosil" is a registered trade mark of Nippon Aerosil) and the like maybe used as a viscosity improver or a thickener, but the usage of a polythiol of low viscosity can be troublesome in operation because of a strong offensive odour. It has been found that triallyl isocyanurate and triallyl cyanurate show an excellent dilution effect and also have high reactivity.

The resin composition contains the aforementioned polythiol, polyene and photoinitiator as the essential components, but according to necessity or desire, may also contain such additives as an oxidation inhibitor, a polymerization inhibitor, a thixotropy improver, a silane coupling agent, a curing promoter and a filler.

The light to be used for the curing of the light curable resin composition may be visible light or ultraviolet rays, or radiation containing both visible wave lengths and ultraviolet wave lengths. Thus, whilst there is no restriction on the wave length of the radiation to be used, it is preferably selected in accordance with the kind of photoinitiator being used. However, it is preferable to use a visible light of wave length between 350 nm and 600 nm, in order to avoid ill effects on the liquid crystal materials.

Thus, according to a further aspect of the invention, there is provided a light-curable resin composition for the sealing and/or encapsulation and/or providing an inner structural component of a liquid crystal display device, said composition having a viscosity of from 20 to 500 poises at 25° C. and comprising:
(1) a polyene component comprising at least one compound having two or more non-aromatic carbon-carbon unsaturated bonds per molecule, said component containing triallyl isocyanurate and/or triallyl cyanurate;
(2) a polythiol component containing at least one compound having two or more mercapto groups per molecule, and
(3) a visible light sensitive photoinitiator.

The invention is illustrated but not limited by the following Examples in which all parts are by weight.

EXAMPLE 1

Eighty five (85) parts of an epoxy resin, Epolite 400P manufactured by Kyoeisha Yushi, 100 parts of trimethylolpropane tris (mercaptopropionate) and 0.14 parts of 2,4,6-tris (dimethylaminomethyl) phenol were put in a glass reactor and were reacted at 80° C. for 10 hours with stirring. The concentration of mercapto group in this reaction product was 2.6 mmol/g.

To 100 parts of this resin, 30 parts of triallyl isocyanurate and 1.3 parts of trimethylbenzoyl diphenylphosphine oxide were added and mixed by kneading with release of air. The viscosity of this resin was 50 poises at 25° C.

EXAMPLE 2

Seventy (70) parts of an epoxy resin, Epolite 400P manufactured by Kyoeisha Yushi, 90 parts of pentaerythritol tetrakis (mercaptopropionate) and 0.15 parts of 2,4,6-tris(dimethylaminomethyl) phenol were put in a glass reactor and reacted at 80° C. for 7 hours with stirring. The concentration of mercapto group in this reaction product was 3.0 mmol/g.

To 100 parts of this resin, 40 parts of triallyl isocyanurate and 1.4 parts of trimethylbenzoyl diphenylphosphine oxide were added and mixed by kneading with release of air. The viscosity of this resin was 65 poises at 25° C.

EXAMPLE 3

Fifty (50) parts of urethane acrylate oligomer prepared with polybutadiene, TEA-1000 manufactured by Nippon Soda, 50 parts of neopentyl glycol diacrylate, 20 parts of 1.4 butanediol dimercaptopropionate, 1 part of trimethylbenzoyldiphenylphosphine oxide and 2 parts of Aerosil 200 were mixed by kneading with release of air. The viscosity of this resin was 30 poises at 25° C.

Comparative Example 1

Fifty (50) parts of urethane acrylate oligomer prepared with polybutadiene, TEA-1000 manufactured by Nippon Soda, 50 parts of neopentyl glycol diacrylate, 1 part of trimethylbenzoyl diphenylphosphine oxide and 2 parts of Aerosil 200 were mixed by kneading with release of air. The viscosity of this resin was 30 poises at 25° C.

Comparative Example 2

Three (3) parts of (benzene cyclopentadienyl) ferro (II) hexafluorophosphate was added to 100 parts of an alicyclic epoxy resin, ERL8728 manufactured by Union Carbide, and mixed by kneading with release of air. The viscosity of this resin was 35 poises at 25° C.

Comparative Example 3

Fifty (50) parts of trimethylolpropane tris (mercaptopropionate), 50 parts of neopentyl glycol diacrylate and 1 part of trimethylbenzoyl diphenylphosphine oxide were mixed by kneading with release of air. The viscosity of this resin was 3 poises at 25° C.

Comparative Example 4

Fifty (50) parts of bisphenol type epoxy resin, DER838J manufactured by Dow Chemical Co., 150 parts of trimethylolpropane tris (mercaptopropionate) and 0.15 parts of 2,4,6-tris(dimethylaminomethyl) phenol were put in a glass reactor and stirred at 80° C. for 5 hours. The concentration of mercapto group in this resin was 3.0 mmol/g.

To 100 parts of this resin, 30 parts of triallyl isocyanurate and 1 part of trimethylbenzoyl diphenylphosphine oxide were added and mixed by kneading with release of air. The viscosity of this resin was 1300 poises at 25° C.

In order to evaluate the properties of the resin compositions obtained in accordance with the above mentioned Examples and Comparative Examples, they were used for the sealing and encapsulation of liquid crystal cells for display devices. The results are given below.

BRIEF DESCRIPTION OF THE DRAWINGS

The use of the resin compositions will now be described with reference to the accompanying drawings in which:

Referring to FIGS. 1 and 2, a liquid crystal cell comprises transparent glass substrates 1a and 1b provided with transparent electrodes 5a and 5b, a spacer 4 to maintain the glass substrates 1a and 1b at a fixed distance apart, peripheral sealant 2 provided with liquid crystal inlet 3 and a space 6 defined by the glass substrates and spacer.

Figure 1:
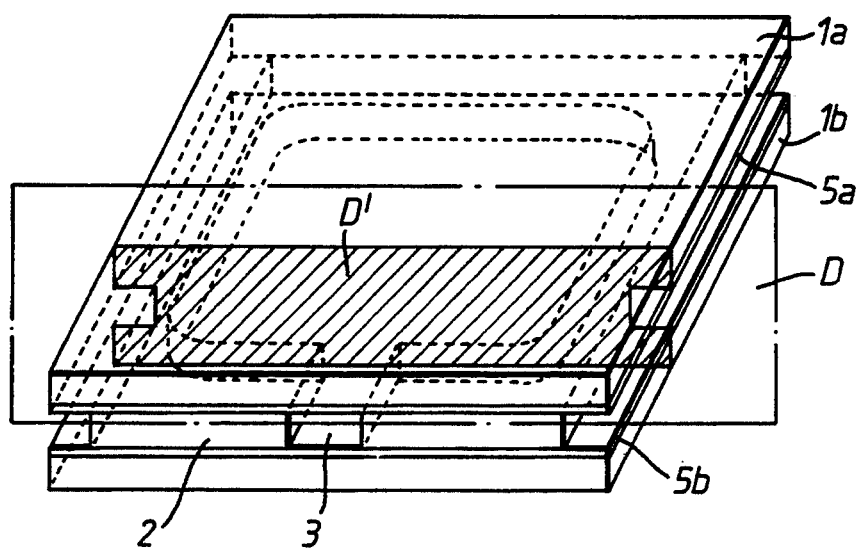
FIG. 1 is an oblique sketch of a liquid crystal cell.
Figure 2:
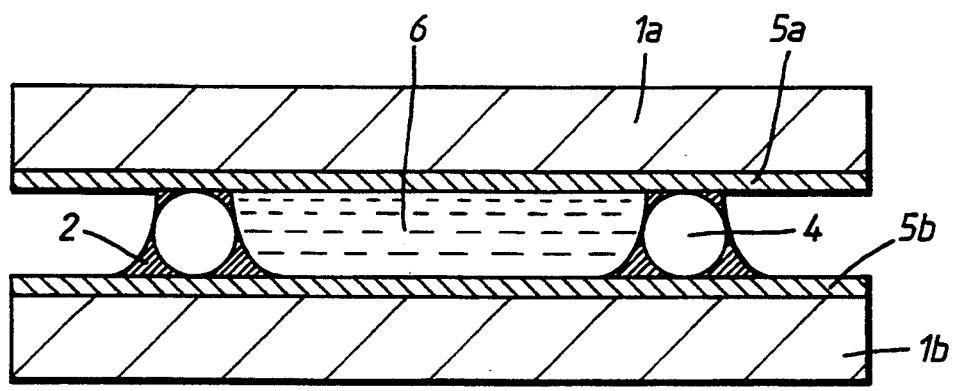
FIG. 2 is a cross section showing in detail section $D^1$ on the plane D in FIG. 1.

The first step in the preparation of the liquid crystal cell was the forming of a transparent electrode 5a, consisting for example of indium stannous oxide, on a glass substrate 1a, an oriented membrane made of polyimide resin then being formed on the transparent electrode followed by a rubbing treatment. A resin composition as prepared in each Example or Comparative Example was then applied to the peripheral parts of the glass substrate and to the inner partition (not shown in FIGS. 1 and 2) of the cell by screen printing. The glass plate 1a was then combined with a second glass plate 1b, to which the same treatment had been applied, and a spacer 4 of 10 microns thickness, and pressure was applied to ensure adhesion. The cell, so formed, was irradiated by a xenon lamp (0.1 W/cm$^2$) for 5 minutes to cure the resin. A liquid crystal (ZL 11636 manufactured by Merck & Co) was then injected into the cell via inlet 3 using the vacuum method and the resin composition used as peripheral sealant was applied to encapsulate the liquid crystal inlet. After standing for 5 minutes, the encapsulant composition was irradiated by the xenon lamp for 5 minutes to effect cure.

The state of the liquid crystal in the liquid crystal cells thus prepared was observed under a polarising microscope immediately after encapsulation and also after allowing the cell to stand for a fixed time under high temperature/high humidity conditions (80° C./90%RH).

Figure 3:
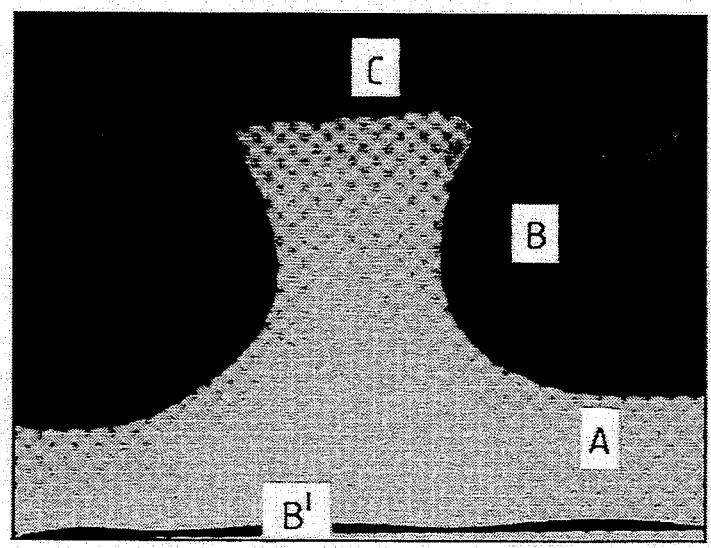
FIG. 3 is a reproduction of a photograph, taken using a polarising microscope (magnification 40 times) of the interface between the liquid crystal and the resin in the liquid crystal cell, prepared using the resin composition of Example 1, after standing for 500 hours at 80° C. and 90% RH.

Referring to FIG. 3, part A where light passes through is liquid crystal, B is peripheral sealant and structural material for the interior of the cell and C is encapsulant for the inlet. It is clear from FIG. 3 that no disturbance of the initial liquid crystal alignment has occurred at the interface of the liquid crystal and the resin composition of Example 1. Similarly, the resin compositions of Examples 2 and 3 produced no leakage of liquid crystal or disturbance of liquid crystal alignment.

Figure 4:
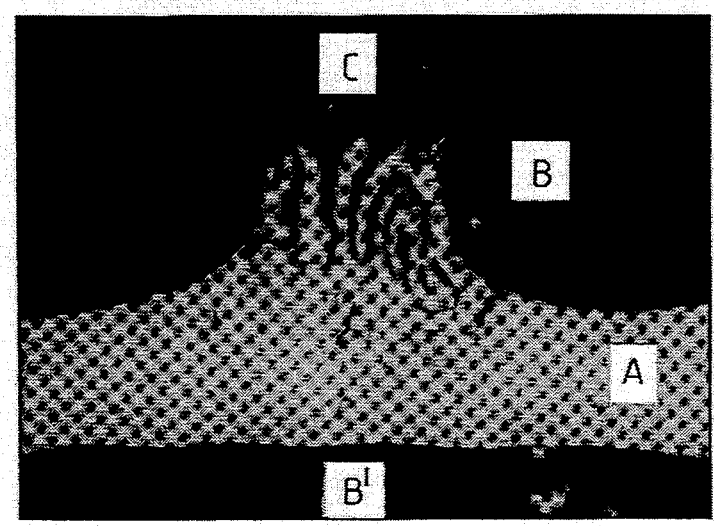
FIG. 4 is a reproduction of a photograph, taken using a polarising microscope (magnification 40 times), of the interface between the liquid crystal and the resin in the liquid crystal cell, prepared using the resin composition of Comparative Example 1, after standing for 15 hours at 80° C. and 90% RH.

Referring to FIG. 4, part A where light passes through is again liquid crystal and part B is sealant/encapsulant. It is obvious from the schlieren effect that can be seen at the interface between the liquid crystal and the encapsulant that the initial uniform alignment of the liquid crystal has been disturbed by the resin composition of Comparative Example 1. When the resin composition of Comparative Example 2 was used, no disturbance of alignment at the interface between the liquid crystal and the encapsulant was observed but a leakage of liquid crystal occurred after standing at 50° C. and 90% RH for 300 hours. When the resin composition of Comparative Example 3 was used as encapsulant, a large quantity of the resin infused into the liquid crystal because of the low viscosity of the resin. By contrast, when the high viscosity resin composition of Comparative Example 4 was used, it took more than 10 minutes to obtain a proper infusion of the resin into the liquid crystal and operating difficulties were then experienced.

What is claimed is:

1. A liquid crystal display device including two electrically insulating substrates, electrodes on the inner surfaces of the substrates, a film of liquid crystal material contained between the electrodes and a resinous material as sealant, encapsulant or inner structural component characterised in that the resinous material is the product of light-curing a light-curable resin composition comprising at least one compound having two or more non-aromatic carbon-carbon unsaturated bonds per molecule, at least one compound having two or more mercapto groups per molecule and a photoinitiator.

2. A device according to claim 1 wherein the photoinitiator is a visible light sensitive photoinitiator.

3. A device according to claim 1 or claim 2 wherein the viscosity of the light-curable resin composition is between 20 and 500 poises at 25° C.

4. A device according to claim 1 wherein the compound having two or more non-aromatic carbon-carbon unsaturated bonds per molecule comprises triallyl isocyanurate or triallyl cyanurate.

* * * * *